United States Patent [19]

Glance

[11] Patent Number: 4,914,666
[45] Date of Patent: Apr. 3, 1990

[54] RANDOM-ACCESS DIGITALLY -TUNED OPTICAL FREQUENCY SYNTHESIZER

[75] Inventor: Bernard Glance, Colts Neck, N.J.

[73] Assignee: AT&T Bell Laboratories, Murray Hill, N.J.

[21] Appl. No.: 347,122

[22] Filed: May 4, 1989

[51] Int. Cl.$^4$ .............................................. H01S 3/10
[52] U.S. Cl. ....................................... 372/20; 372/32; 372/38
[58] Field of Search ....................... 372/20, 29, 32, 38, 372/26

[56] References Cited

U.S. PATENT DOCUMENTS

| | | | |
|---|---|---|---|
| 4,719,636 | 1/1988 | Yamaguchi | 373/20 |
| 4,806,873 | 2/1989 | Nagano | 372/38 |
| 4,829,527 | 5/1989 | Wortman | 373/20 |
| 4,829,535 | 5/1989 | Utaka | 372/32 |

OTHER PUBLICATIONS

R. V. Pound, Radiation Laboratory Series 16, 1948, pp. 342–343.
Y. Kotaki, et al., 1.55 μm Wavelength Tunable FBH–DBR Laser, Electronics Letters, Mar. 26, 1987, vol. 23, No. 7, pp. 325–327.
S. Murata, et al., Over 720 GHz (5.8 nm) Frequency Tuning by a 1.5 μm DBR Laser with Phase and Bragg Wavelength Control Regions, Electronics Letters, Apr. 9, 1987, vol. 23, No. 8, pp. 403–405.
T. L. Koch et al., Continuously Tunable 1.5 μm Multiple-Quantum-Well GaInAs/GaInAsP Distributed-Bragg-Reflector Lasers, Electronics Letters, Nov. 10, 1988, vol. 24, No. 23, pp. 1431–1433.
B. S. Glance, et al., Densely Spaced FDM Coherent Star Network with Optical Signals Confined to Equally Spaced Frequencies, Jnl. Lightwave Tech., vol. 6, No. 11, Nov. 1988, pp. 1770–1781.
B. Glance, et al., Frequency Stabilization of FDM Optical Signals Originating from Different Locations, Electronic Letters, Nov. 5, 1987, vol. 23, No. 23, pp. 1242–1245.
B. Glance, et al., Frequency Stabilization of FDM Optical Signals, Electronics Letters, Jul. 2, 1987, vol. 23, No. 14, pp. 750–752.

Primary Examiner—James W. Davie
Attorney, Agent, or Firm—Richard B. Havill

[57] ABSTRACT

A digitally tuned optical frequency synthesizer includes a laser control arrangement for tuning the laser over a range of frequencies. The laser is tunable in response to different magnitudes of injected bias current. A digital processor determines bias current values which produce the desired different operating frequencies corresponding to a set of Fabry-Perot resonant frequencies. Those current values are stored in the digital processor for ready retrieval. During operation, one of the bias current values is retrieved and is applied to the laser. If the laser characteristic curve has drifted, an incremental bias current is determined and is added to the retrieved bias current value. For future use, this new bias current value is stored in the digital processor in place of the originally retrieved bias current value. The digital processor additionally calculates new bias current values for all of the desired frequencies of operation and stores those new values for subsequent selection.

4 Claims, 3 Drawing Sheets

RANDOM-ACCESS DIGITALLY-TUNED OPTICAL FREQUENCY SYNTHESIZER

This invention relates to a laser which is arranged for selectable frequency tuning.

BACKGROUND OF THE INVENTION

There are known arrangements for tuning a laser to operate at selected frequencies throughout a wide range of frequencies. Frequency-tunable semiconductor lasers are attractive devices for optical frequency division multiplex transmission systems. In a tunable arrangement, a distributed Bragg reflector laser provides a very large tuning range when different values of injection, or bias, current are injected into the phase control and the distributed Bragg reflector regions of the laser.

In the prior art, changes of frequency have been made by selecting the values of bias current from continuously variable analog functions. Although the tuning range is very wide, there is a problem when the laser is changed from a first frequency to a second frequency and thereafter is to be returned to the exact first frequency. In returning the laser to the first frequency, it is very difficult to select the injection current value which will produce the exact first frequency. The exact frequencies are defined by the resonances of a Fabry-Perot resonator. There is no provision in the prior art to measure the drift of the operating characteristic of the laser.

SUMMARY OF THE INVENTION

This problem and others are solved by a digitally tuned optical frequency synthesizer including a laser control arrangement for tuning the laser exactly to a desired resonant frequency selected from a range of frequencies. The laser is tunable in response to different values of control signal. A digital processor determines control signal values which produce different operating frequencies. Those control signal values are stored in the digital processor for ready retrieval. During operation, one of the control signal values, representing a desired operating frequency, is retrieved from storage and is applied to the single frequency laser. If the laser characteristic curve has drifted, a control signal error is determined by a control circuit part of the feedback loop and is added to the retrieved control signal value. The digital processor measures the value of the control signal error and derives a new total control signal value that is stored in place of the originally retrieved control signal value.

When the digital processor determines that the laser characteristic has drifted and causes a error control signal, the digital processor additionally calculates new control signal values for all of the desired frequencies of operation and stores those new control signal values in the appropriate locations in the digital processor for subsequent selection and use.

As a result, the laser is controlled by readily selectable control signal values which produce the exact desired operating frequencies. An optical transmitter using this arrangement can be applied advantageously in an optical frequency division multiplexed transmission system.

BRIEF DESCRIPTION OF THE DRAWING

The invention may be better understood when the following detailed description is read with reference to the drawing wherein.

DETAILED DESCRIPTION

Figure 1:
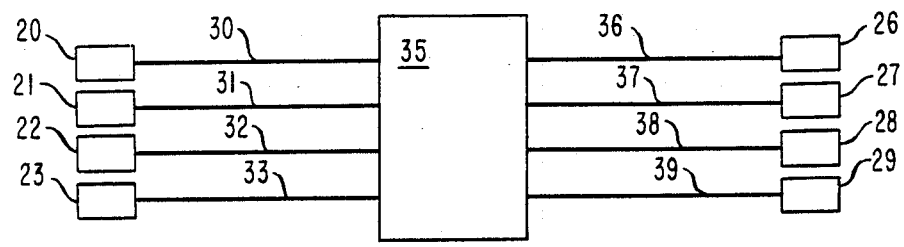
FIG. 1 is a block diagram of an optical frequency division multiplex arrangement.

Referring now to FIG. 1, there is shown a block diagram of an optical frequency division multiplex arrangement for transmitting information from a set of transmitting stations 20, 21, 22 and 23 to a set of receiving stations 26, 27, 28 and 29.

Optical fibers 30, 31, 32 and 33 carry the optical signals, respectively, from the transmitting stations 20, 21, 22 and 23 to an optical star coupler 35. Each of those optical signals includes information modulated on an optical carrier. For example, the transmitting stations 20, 21, 22 and 23 each transmit information on a different optical carrier frequency selected from some number N (where, e.g., N = forty) of available optical carrier frequencies. By choice of an operator, those forty optical carrier frequencies are available from each of the transmitting stations 20, 21, 22 and 23. As a result of interactive controls, only one station at a time can select any one of the available optical carrier frequencies. Concurrently, the other stations can be operated at different ones of the carrier frequencies. The transmitting stations are synchronized with one another by a scheme, such as the one disclosed in a copending patent application, Ser. No. 059.973, filed in my name on June 9, 1987. The teaching of that patent application is incorporated herein by reference.

All of the concurrently selected optical carrier frequencies are multiplexed together within the optical star coupler 35. From the star coupler, all concurrently transmitted carriers are forwarded through all of the fibers 36, 37, 38 and 39 to the receiving stations 26, 27, 28 and 29 which are also operated in synchronism.

Receiving stations 26, 27, 28 and 29 may be operated in either of two different ways. The first way to operate is to assign each of the receiving stations a fixed predetermined one of the forty optical carrier frequencies. Such predetermined frequency assignments limit the flexibility of the system to the extent that each transmitting station must select the optical carrier frequency which can be received by the desired receiving station. A second way to use the optical carrier frequencies in the receiving stations, is to provide each of the receiving stations with an arrangement which at any time will enable the operator of each receiving station to select for reception any one of the forty optical carrier frequencies being transmitted. The second way to operate the receiving stations is described more completely in another patent application Ser. No. 347,121, filed concurrently herewith in my name. The teaching of that patent application is incorporated herein by reference.

All of the transmitting stations are equipped with a tunable laser arrangement wherein the laser can selectively produce any one of the forty optical carrier frequencies at the option of the transmitting station operator.

The transmitting stations 20, 21, 22, and 23 of FIG. 1 have been arranged to compensate, or correct, automatically for any variation, or drift, in the device or circuit characteristics. By thus compensating for drift, the transmitting station operator is assured that any selection of operating carrier frequency for the operator's transmitting station will result in that transmitting station operating at the specifically selected optical carrier frequency rather than some other frequency to which the station might otherwise tend to drift.

A description of the automatic control arrangement for the transmitting stations is presented in greater detail hereinafter with reference to FIGS. 2 through 7.

Figure 2:
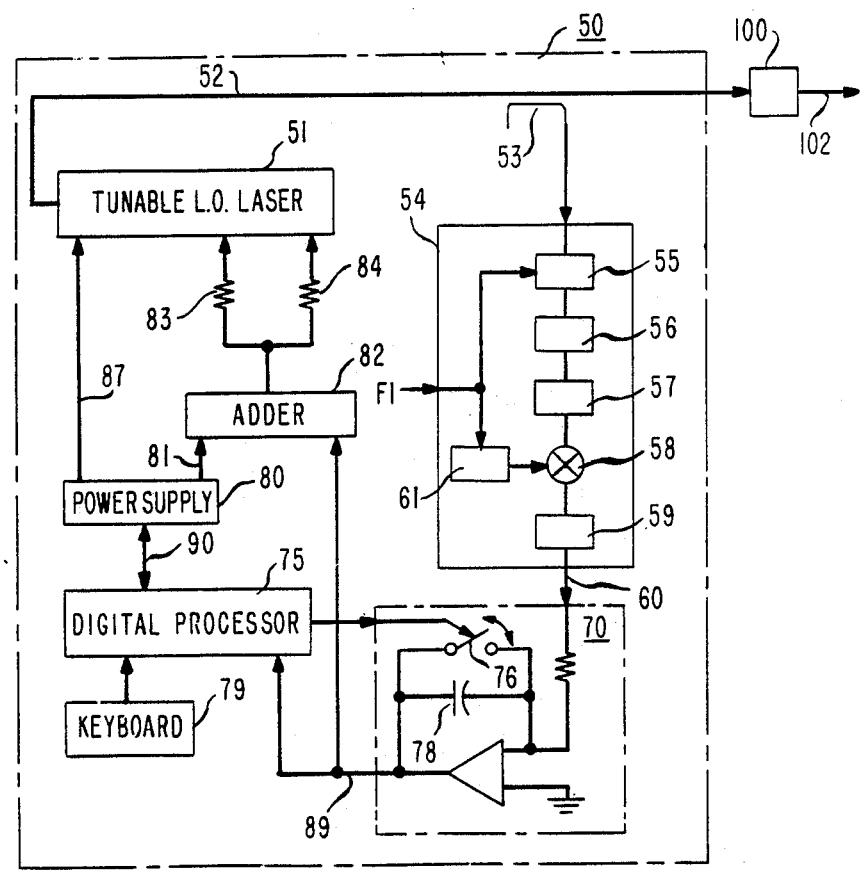
FIG. 2 is a block diagram of a tuned optical frequency synthesizer.

Referring now to FIG. 2, there is shown a diagram of a tunable optical frequency synthesizer arrangement 50. This laser frequency selection and control arrangements 50 can be used for each one of the transmitting stations 20, 21, 22 and 23 of FIG. 1. In FIG. 2, the arrangement 50 includes a distributed Bragg reflector laser 51 which produces a tunable single frequency output signal that is coupled into an optical fiber, or guide 52. A single frequency laser is a laser that produces essentially a single longitudinal mode. An optical coupler 53 taps a fraction of the optical signal from the guide 52 to be applied to an opto-electronic arrangement 54 that stabilizes a series of spaced optical output frequencies of the laser 51 by using the resonant characteristics of a Fabry-Perot resonator. The arrangement 54 phase modulates the tapped sample of the laser output in a phase modulator 55 in response to a modulation signal F1. The Fabry-Perot resonator 56, in response to the output of the phase modulator 55, produces a selectable set of phase modulated resonance frequencies that are applied to a photodiode 57. The photodiode 57 detects the time derivative of the phase modulation as the optical signal frequency drifts across a resonance of the Fabry-Perot resonator 56. Resulting photocurrent is correlated with an appropriately phase-adjusted version of the phase modulation signal F1 in a balanced mixer 58. A quadrature phase shift device 61 makes such adjustment. The output of the balanced-mixer 58 is filtered and amplified through a filter and amplifier 59 into an error signal on a lead 60. Thus the arrangement 54 generates, on the lead 60, an error signal that is used for locking the laser oscillator frequency to the selected operating frequency. A more detailed description of the arrangement 54 is presented in the aforementioned copending patent application, Ser. No. 059,973, filed in my name. There are other well known techniques for producing an error signal, as produced by the opto-electronic arrangement 54. See for example, R. V. Pound, Radiation Laboratory Series 16, pages 342-343.

In the system of FIG. 2, there is a need to guarantee that the lasers of the transmitters will be controlled to operate at the desired resonance frequencies.

Figure 3:
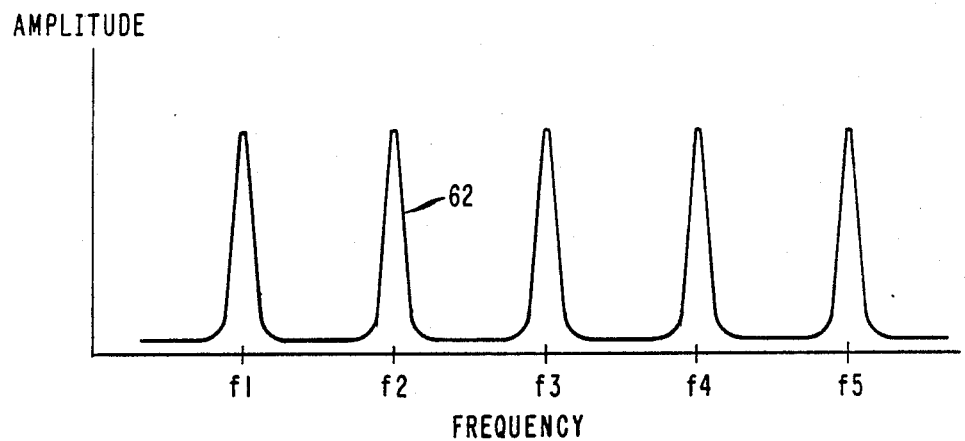
FIG. 3 shows a Fabry-Perot oscillator output signal vs frequency characteristic curve.

Briefly, FIG. 3 presents a frequency domain curve 62 of the output of the Fabry-Perot resonator 56. The Fabry-Perot resonant frequencies occur at the frequencies f1, f2, f3, f4 and f5 where the curve 62 peaks in FIG. 3. Desired optical carrier signal frequencies for the output of the synchronizer 50 of FIG. 2 coincide with the Fabry-Perot resonant frequencies shown in FIG. 3.

Figure 4:
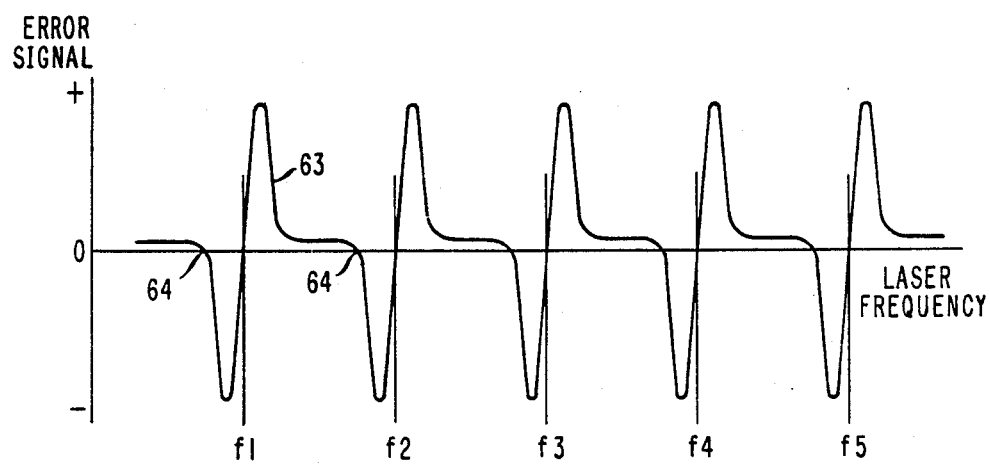
FIG. 4 presents an error signal vs laser oscillator frequency.

In FIG. 4, there is a curve 63 representing an error signal which makes both positive and negative polarity excursions between the resonance frequencies established by the Fabry-Perot resonator. Desired optical carrier signal frequencies coincide with the resonant frequencies of the Fabry-Perot resonator. It is noted that the error signal 63 has zero crossings which coincide with the resonance frequencies f1, f2, f3, f4 and f5 of the Fabry-Perot resonator. Also it is noted that the amplifier inserts an offset voltage to the error signal 63 so that, between the peaks, the flat portions of the error signal are slightly above zero. The reason for this offset voltage will become clear subsequently. During regular operation of the synthesizer 50 of FIG. 2 and from a keyboard 79, the digital processor 75 is given a desired frequency selection from among the frequencies f1, f2, f3, etc., and it applies an appropriate bias current or control signal to the laser 51. A set of such appropriate bias currents is determined for the set of desired operating frequencies and is stored in the digital processor. A process for determining the set of bias currents is described subsequently.

Figure 5:
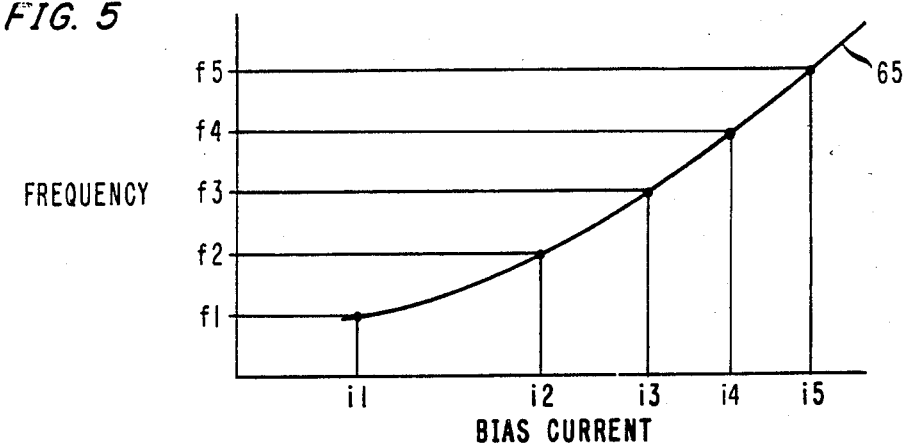
FIG. 5 is a frequency vs bias current characteristic curve for a laser.

Referring now to FIG. 5, there is shown a laser frequency vs bias current characteristic curve 65. Heavy dots on this curve represent the values of laser bias current required to operate the laser 51 of FIG. 2 at the Fabry-Perot resonant frequencies f1, f2, f3, f4 and f5 within a very wide band.

When the tunable laser control arrangement 50 of FIG. 2 is first operated, it operates along the laser characteristic curve 65 of FIG. 5. Values of laser drive current i1, i2, i3, i4 and i5 for the desired Fabry-Perot resonant frequencies f1, f2, f3, f4 and f5 are determined and are stored for subsequent use as the values of laser bias current for determining the desired optical operating frequencies.

For any selected laser, there is a known operating curve. Similarly the Fabry-Perot resonator has known resonant frequencies. Information representing the laser operating curve is stored in the digital processor 75. A set of specific addresses is reserved for storing the laser bias current values which produce the desired operating frequencies. The relevant laser bias current values for producing those frequencies are determined as follows in a calibration process.

A first desired operating frequency, e.g., frequency f1, is selected. From the known laser characteristic curve, an initial laser bias current or control signal is selected. The value of that initial laser bias current is selected to produce a free-running frequency slightly below the first operating frequency f1. From the keyboard 79 the value is put into the digital processor 75 and is read out to a power supply 80 which applies the appropriate value of bias current or control signal by way of a lead 81 to an input of adder 82. That bias current is divided appropriately by resistors 83 and 84 and the resulting portions are applied respectively to the phase control and distributed Bragg reflector regions of the laser 51. Power supply 80 also directly supplies a constant bias current through a lead 87 to the active region of the laser 51.

Since the free-running laser frequency is below the desired Fabry-Perot resonance frequency f1, the feedback loop produces an error signal on the lead 60. On a lead 89, the active integrator 70 produces an incremental laser bias current or control signal error $\delta i1$ which is applied to another input of the adder 82. This incremental laser bias current δi1 is added to the initially selected laser bias current and is applied through the resistors 83 and 84 to the laser 51 driving it to oscillate at the desired Fabry-Perot resonant frequency f1.

The digit processor 75 measures the incremental laser bias current in the lead 89, adds it to the initial laser bias current, and stores the total as a new value of laser bias current at the address for the desired resonant frequency f1.

Similarly an appropriate laser bias current is determined for each of the other desired resonant frequencies f2, f3, f4 and f5. The values of those bias currents are stored by the digital processor in reserved addresses for subsequent selected retrieval.

During subsequent operation, the operator selects the desired resonant frequency by inputting a selection through the keyboard 79 to the digital processor 75. The processor then initializes the active integrator 70 and through a lead 90 requests the appropriate value of laser bias current from the power supply 80, which supplies that value of laser bias current through the adder 82 and resistors 83 and 84 to the laser 51. As long as the laser characteristic has not drifted, the laser operates at the desired Fabry-Perot resonant frequency, and no error signal is generated on the lead 60. No incremental laser drive current δi is generated on the lead 89 by the active integrator 70.

Figure 6:
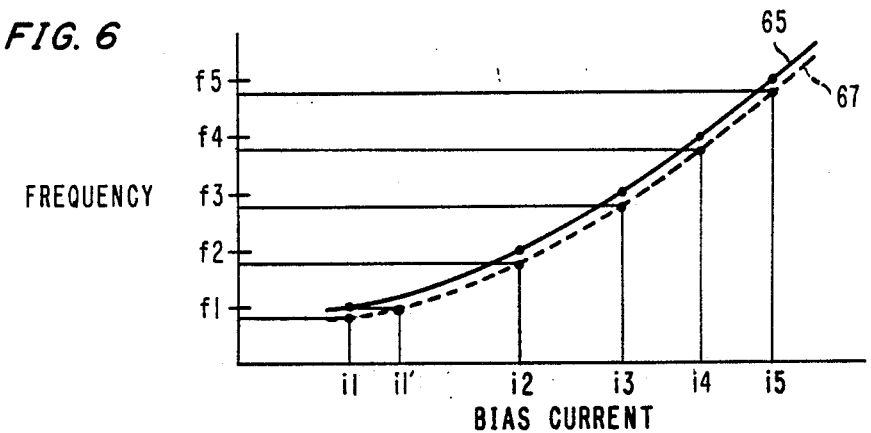
FIG. 6 shows a shifted frequency vs bias curent characteristic curve for the laser together with the initial bias current characteristic curve.

As a result of device aging or as a result of environmental changes, the laser characteristic curve may change to a different position, for example, as presented by an alternative dotted line characteristic curve 67 of FIG. 6. When the environment of the laser 51 shifts the operating characteristic to the alternative characteristic curve 67, applying any of the predetermined values of bias current i1, i2, i3, i4 and i5 from the original laser characteristic curve 65 will cause an incorrect laser frequency to be selected. Because such changes are expected to occur in the position of the laser characteristic over any long duration of operation in the field, the circuitry included in the laser feedback control loop operates to correct for those changes.

In FIG. 2 a servo-control circuit includes the active integrator 70 which responds to the error signal on the lead 60 and to signals from the digital processor 75. This servo-control circuit includes a switch 76 placed across a capacitor 78. Charging and discharging of the capacitor 78 is controlled by signals to the switch from the digital processor 75.

Activation of frequency locking is initiated by closing the switch 76 and discharging the capacitor 78. Once the capacitor 78 is discharged, the frequency locking operation is commenced by opening the switch 76. For a selected laser biasing current that produces a laser free-running frequency, the laser frequency varies during the locking process in response to the error signal on the lead 60. As shown by the curve 63 of FIG. 3, the error signal on the lead 60 crosses zero at the resonant frequencies f1, f2, f3, etc. From either side of each resonance frequency, the polarity of the error signal is appropriate to drive the laser to the desired Fabry-Perot resonance frequency. In response to the error signal on the lead 60, the active integrator circuit 70 commences to charge the capacitor 78 and develop the incremental bias current needed on the lead 89. This incremental bias current is added by the adder 82 to the selected laser bias current on the lead 81. The resulting total laser bias current drives the laser 51 to oscillate at the desired Fabry-Perot resonant frequency. The frequency function of curve 63 is the frequency of the laser determined by the bias current selected from the power supply 80 plus the integral of the error signal and the offset voltage.

Optical output from the laser 51 is coupled into the optical fiber 52 as an output signal, or carrier wave, from the tuned optical frequency synthesizer 50. An information source 100 modulates that carrier wave with information signals and applies them onto an optical fiber 102.

When the free-running frequency of the laser is equal to the desired Fabry-Perot resonant frequency, no error signal is produced. The digital processor measures, reads, or otherwise determines the value of the incremental laser bias current in the lead 89, adds it to the selected value of bias current, and stores the new total bias current in place of the selected bias current for subsequent retrieval for that Fabry-Perot resonant frequency.

Inclusion of the active integrator 70 of FIG. 2 extends the pull-in range of the circuit beyond the steep slope between peaks of the error signal 63 of FIG. 3 at the zero-crossing of frequency f1. The extended range includes the entire range between the frequencies of the pairs of the other zero crossings 64. Because of the offset current, the frequency locking arrangement avoids frequency sticking, or very long pull-in time which can otherwise be caused by the low amplitude of a non-offset error current.

Each Fabry-Perot resonance has a capture range that equals the range between zero-crossings, such as zero-crossings 64, which are centered unsymmetrically around a resonance because of the offset current.

Importantly, the just described feedback loop of FIG. 2 informs the digital-processor 75 of any drift of the laser operating characteristic. For instance, by reference to FIG. 6, the characteristic may drift from the position of the initial characteristic curve 65 to the position of the alternative characteristic curve 67. When the incremental laser bias current occurs in the lead 89 causing the digital processor 75 to recalculate the value of bias current i1, e.g., i1', for the selected operating frequency, e.g., f1, the displacement of the curve 67 shows that all of the other stored values of laser bias currents i2, i3, i4 and i5 would fail to produce the desired freerunning laser frequencies f2, f3, f4 and f5, respectively. Using the stored characteristic curve data and the known incremental laser bias current, the digital processor 75 calculates and stores new values of laser bias currents i2', i3', i4' and i5' for the frequencies f2, f3, f4 and f5, respectively. Thereafter when any desired frequency is selected for use, the digital processor 75 will cause the laser bias current supplied to the laser to be very close to the correct value for the desired resonant frequency.

Figure 7:
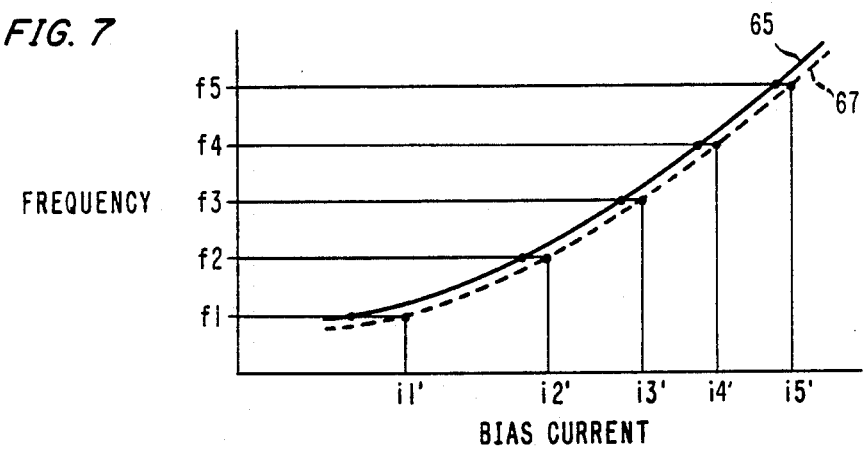
FIG. 7 shows how the arrangement of FIG. 2 compensates for the shifted frequency vs bias current characteristic curve of FIG. 6 so that the laser operates at the desired frequencies selected from the initial frequency vs bias current characteristic curve of FIG. 5.

The foregoing describes an embodiment of a tuned optical frequency synthesizer. This embodiment together with others, which are obvious in view thereof, are within the scope of the appended claims. FIG. 7 shows the result of a recomputation of the values of laser bias currents.

I claim:

1. A laser control arrangement for tuning a laser, the arrangement comprising
   a laser oscillating at a frequency, tunable via a control signal, to any one of a set of resonant frequencies, of a resonator, the resonant frequencies being spaced apart over a range of frequencies;

means, responsive to the oscillating frequency of the laser and to the set of resonant frequencies for determining a set of values of control signal for producing the desired set of oscillating frequencies;

means for storing the set of values of control signal; and means for selecting one of the stored values of control signal for driving the laser to a desired one of the set oscillating frequencies.

2. A laser control arrangement, in accordance with claim 1, further comprising means for determining any difference between a free-running frequency of the laser and the desired oscillating frequency;

means for determining a control signal error to correct the difference between the free-running oscillating frequency of the laser and the desired oscillating frequency of the laser; and means for adding the control signal error to the selected control signal to produce a new control signal value for driving the laser and for storing the new control signal value in place of the selected control signal value.

3. A laser control arrangement, in accordance with claim 2, further comprising means for storing information representing the operating characteristic curve of the laser; and if the control signal error determining means determines a control signal error for the selected oscillating frequency, a processor determines and stores a new set of values of the control signal for producing the selectable set of oscillating frequencies.

4. A laser control arrangement, in accordance with claim 2, wherein the control signal error determining means comprises means responsive to the output of the laser and a set of resonant frequencies for producing an error signal; and integrating means responsive to the error signal for determining the control signal.

* * * * *